United States Patent
Lee

[11] Patent Number: 5,851,705
[45] Date of Patent: Dec. 22, 1998

[54] METHOD FOR MANUFACTURING A SELF-ALIGNED TYPE OUT-RIGGER PHASE SHIFT MASK

[75] Inventor: Jun-Seok Lee, Seoul, Rep. of Korea

[73] Assignee: LG Semicon Co., Ltd., Choongcheongbuk-Do, Rep. of Korea

[21] Appl. No.: 773,595

[22] Filed: Dec. 27, 1996

[30] Foreign Application Priority Data

Dec. 27, 1995 [KR] Rep. of Korea ................. 1995/58734

[51] Int. Cl.[6] ........................................................ G03F 9/00
[52] U.S. Cl. ......................................................... 430/5
[58] Field of Search .................................. 430/5; 216/87

[56] References Cited

U.S. PATENT DOCUMENTS

| | | | |
|---|---|---|---|
| 4,717,689 | 1/1988 | Maas et al. | 437/225 |
| 5,136,344 | 8/1992 | Pronko | 357/4 |
| 5,217,830 | 6/1993 | Lowrey | 430/5 |
| 5,260,152 | 11/1993 | Shimizu et al. | 430/5 |
| 5,300,379 | 4/1994 | Dao et al. | 430/5 |
| 5,525,192 | 6/1996 | Lee et al. | 156/651.1 |

Primary Examiner—Marion E. McCamish
Assistant Examiner—Cheryl Juska
Attorney, Agent, or Firm—Morgan, Lewis & Bockius LLP

[57] ABSTRACT

A method of manufacturing a self-aligned type out-rigger phase shift mask includes the steps of forming light-shielding patterns spaced apart by a predetermined distance from each other on a transparent substrate. A photosensitive organic layer is formed on the light-shielding patterns and the substrate. The photosensitive organic layer is surface-treated with an organic material to form a hard-soluble layer on a surface of the photosensitive organic layer into which the organic material soaks. Back side exposure and development is performed to form a hard-soluble layer/photosensitive organic material stacked pattern having overhanging parts on upper side edges of the stacked pattern. The substrate is selectively etched by using the hard-soluble layer/photosensitive organic material stacked pattern as a mask to define a first pattern and a second pattern on a surface of the substrate between the light-shielding patterns. Then, the hard-soluble layer/photosensitive organic material stacked pattern is removed.

27 Claims, 6 Drawing Sheets

METHOD FOR MANUFACTURING A SELF-ALIGNED TYPE OUT-RIGGER PHASE SHIFT MASK

BACKGROUND OF THE INVENTION

1. Field of the Invention

The present invention relates to a method of manufacturing a mask used during manufacturing of a semiconductor device, and more particularly, the present invention relates to a method for manufacturing a self-aligned type out-rigger phase shift mask.

2. Discussion of the Related Art

Until recently, various lithography methods have been developed for integrating a semiconductor device. Among these, there is a method where a phase shift effect is used to make high resolution patterning possible, which has been rapidly repeated. Of these, most endeavors were focused on manufacturing techniques of an alternate type phase shift mask (PSM), a RIM-type PSM, an out-rigger type PSM, and the like.

A common feature of these techniques was to add a shifter material so as to utilize a phase shift effect (e.g., 180° shift and others). This represented a step away from conventional simple conceptions such as using a light-shielding/light-transmitting type system.

In the aforementioned method, a light-transmitting layer maintains a transmissivity close to 100% and a shifter layer forms a step. In this way, a phase differs with respect to transmitted light of the light-transmitting layer by 180°. At this time, the light-transmissivity of the shifter layer can be variously changed according to mask shapes and manufacturing objectives. Among these, the remainder excluding the alternate type PSM have a shape such that the light-transmitting layer or the shifter layer is properly arranged with the light-shielding part forming a boundary.

M. D. Levenson of IBM first embodied a method for realizing the PSM in SPIE 1982. Since that time, a method of applying the out-rigger type PSM was suggested.

In a common method proposed at an initial stage, an open part surrounded with a light-shielding part is formed on a mask surface. Then, a supplementary pattern is arranged on all of the sides of the circumference. To improve this, a PSM having a shape wherein all of the circumference of the open part is surrounded with a fine shifter was disclosed in U.S. Pat. No. 5,260,152.

Hereinafter, a method for manufacturing the PSM disclosed in U.S. Pat. No. 5,260,152 will be described with reference to the process sequence shown in FIGS. 1A to 1D.

As shown in FIG. 1A, on a transparent substrate 1, a light-shielding pattern 2 is formed so as to expose a predetermined part of a surface of substrate 1. After forming a resist pattern 3 on light-shielding pattern 2, light-shielding pattern 2 is wet etched using resist pattern 3 as a mask so as to have a wider open width (b) than an open width (a) of resist pattern 3.

As shown in FIG. 1B, a shifter material having a phase shift effect, e.g., $SiO_2$, is deposited by evaporation on the entire surface of the above pattern, thereby forming $SiO_2$ pattern 5' on resist pattern 3 and $SiO_2$ pattern 5 on substrate 1 where the surface thereof is exposed and on resist pattern 3.

As shown in FIG. 1C, $SiO_2$ pattern 5' deposited on resist pattern 3 and portions of resist pattern 3 are removed through a lift-off method, thereby completing a PSM manufacture.

FIG. 1D shows a plan view of the planar structure of a PSM manufactured through such aforementioned process. In FIG. 1D, 6a and 6b depict the space at right and left sides of a supplementary pattern formed between $SiO_2$ pattern 5 and light-shielding pattern 2.

However, in this process, wet etching is carried out when forming light-shielding pattern 2, which results in the generation of an under-cut on the etched surface of the light-shielding pattern. Thus, the light-shielding effect of light-shielding pattern 2 is not uniform. In addition, it is difficult to control the space or size of the supplementary pattern, which results in deterioration of the PSM resolution.

Meanwhile, as another manufacturing method, U.S. Pat. No. 5,300,379, discloses a method where a mask substrate is etched to thereby realize an out-rigger type PSM. This method reversely forms the phase between supplementary patterns and the phase between holes on a basis of the adjacent hole, in order to exclude mutual interference between the dense patterns. This method will be described below with reference to the process sequence shown in FIGS. 2A to 2D.

To begin with, as shown in FIG. 2A, a light-shielding layer 12 (e.g., a Cr layer) is deposited on a transparent substrate 1, and then, a resist is deposited thereon. The resist is etched so as to selectively expose portions of the surface of light-shielding layer 12, thereby forming a first resist pattern 3.

As shown in FIG. 2B, using resist pattern 3 as a mask, light-shielding layer 12 is etched where the surface thereof is exposed and a portion of substrate 1 thereunder is also etched. Then, resist pattern 3 is removed.

As shown in FIG. 2C, resist is deposited once more on the entire surface of the above pattern and exposed selectively, thereby forming a resist pattern 3'.

As shown in FIG. 2D, exposed light-shielding layer 12' is removed using resist pattern 3 as a mask. Then, resist pattern 3' is removed to thereby complete the PSM manufacture.

As a result of the foregoing, in the case of crowded mask patterns, the light interference phenomenon between supplementary patterns 7a and 7b is improved. However, when forming supplementary patterns 7a and 7b or when forming main patterns 8a and 8b, the accurate alignment of the respective patterns becomes difficult. Thus, there is a disadvantage in that the progress of the process is also difficult.

SUMMARY OF THE INVENTION

Accordingly, the present invention is directed to a method for manufacturing a self-aligned type out-rigger phase shift mask that substantially obviates one or more of the problems due to limitations and disadvantages of the related art.

An object of the present invention to provide a method for manufacturing a self-aligned type out-rigger PSM that improves the alignment accuracy of a supplementary pattern while preventing light interference phenomenon between adjacent out-rigger patterns.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for manufacturing a self-aligned type out-rigger phase shift mask includes the steps of: forming light-shielding patterns spaced apart by a predetermined distance from each other on a transparent substrate; forming a photosensitive organic layer on light-shielding patterns and the substrate; surface-treating the photosensitive organic layer with an organic material suppressing a developing solubility rate of the photosensitive organic layer, to thereby form an insoluble layer on a surface of the photosensitive organic layer into which the organic material soaks; performing back side exposure and development to thereby form insoluble layer/ photosensitive organic material stacked patterns having over-hanging parts on upper sides of multiple edges thereof, on the light-shielding patterns; selectively etching the substrate by using the insoluble layer/photosensitive organic material stacked patterns as a mask, to thereby define a main pattern and a supplementary pattern on a surface of the substrate between the light-shielding patterns; and removing the insoluble layer/photosensitive organic material stacked patterns.

In another aspect, the present invention provides a method of manufacturing a self-aligned type out-rigger phase shift mask, the method comprising the steps of: forming light-shielding patterns spaced apart by a predetermined distance from each other on a transparent substrate; depositing a first photosensitive organic layer on the light-shielding pattern and the substrate and performing selective exposure so as to expose a surface of the substrate; etching the exposed surface of the substrate to a predetermined thickness using the first photosensitive organic layer as a mask, and then removing the first photosensitive organic layer; forming a second photosensitive organic layer on the light-shielding patterns and the substrate; surface-treating the second photosensitive organic layer with an organic material suppressing a developing solubility rate of the second photosensitive organic layer, to thereby form an insoluble layer on a surface of the second photosensitive organic layer into which the organic material soaks; performing back side exposure and development to thereby form insoluble layer/second photosensitive organic material stacked patterns having over-hanging parts on upper sides of multiple edges thereof, on the light-shielding patterns; forming a light-transmissive film on the exposed surface of the substrate, using the insoluble layer/photosensitive organic material stacked patterns as a mask; and removing the insoluble layer/ photosensitive organic material stacked patterns to thereby define a main pattern and a supplementary pattern on the substrate between the light-shielding patterns.

In another aspect, the present invention provides a method of manufacturing a self-aligned type out-rigger phase shift mask including the steps of forming light-shielding patterns spaced apart by a predetermined distance from each other on a transparent substrate; forming a photosensitive organic layer on the light-shielding patterns and the substrate; surface-treating the photosensitive organic layer with an organic material to form an insoluble layer on a surface of the photosensitive organic layer into which the organic material soaks; performing back side exposure and development to form an insoluble layer/photosensitive organic material stacked pattern having over-hanging parts on upper side edges of the stacked pattern; selectively etching the substrate by using the insoluble layer/photosensitive organic material stacked pattern as a mask to define a first pattern and a second pattern on a surface of the substrate between the light-shielding patterns; and removing the insoluble layer/photosensitive organic material stacked pattern.

In a further aspect, the present invention provides a method of manufacturing a self-aligned type out-rigger phase shift mask including the steps of forming light-shielding patterns spaced apart by a predetermined distance from each other on a transparent substrate; depositing a first photosensitive organic layer on the light-shielding pattern and the substrate and selectively exposing a surface of the substrate; etching the exposed surface of the substrate to a predetermined thickness using the first photosensitive organic layer as a mask, and then removing the first photosensitive organic layer; forming a second photosensitive organic layer on the light-shielding patterns and the substrate; surface-treating the second photosensitive organic layer with an organic material to form an insoluble layer on a surface of the second photosensitive organic layer into which the organic material soaks; performing back side exposure and development to form a stacked pattern of the insoluble layer and second photosensitive organic material, the stacked pattern having over-hanging parts on upper side edges of the stacked pattern; forming a light-transmissive. film on the exposed surface of the substrate using the stacked pattern as a mask; and removing the stacked pattern to define a first pattern and a second pattern on the substrate between the light-shielding patterns.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENTS

Reference will now be made in detail to the preferred embodiments of the present invention, examples of which are illustrated in the accompanying drawings.

Hereinafter, the preferred embodiments of the present invention will be described with reference to the attached drawings.

In the present invention, a supplementary pattern is formed by self-alignment using a resist pattern including a hard-soluble layer formed on a light-shielding pattern. Accordingly, the present invention increases the alignment accuracy of the supplementary pattern and to prevent the light interference between adjacent out-rigger patterns. These will be described below with reference to the process sequence shown in FIGS. 3A–3E and FIGS. 4A–4H.

Here, the process sequence shown in FIGS. 3A to 3E corresponds to a method for manufacturing a PSM according to a first embodiment of the present invention. The process sequence shown in FIGS. 4A to 4G corresponds to a method for manufacturing a PSM according to a second embodiment of the present invention. To begin with, the first embodiment will be described.

Figure 1A:
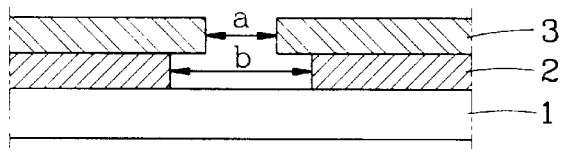
FIGS. 1A to 1C are cross-sectional views illustrating a method for manufacturing a PSM according to a conventional method.
Figure 1B:
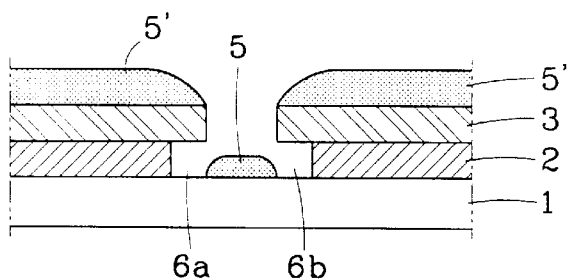
Figure 1C:
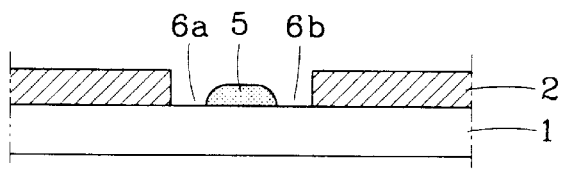
Figure 1D:
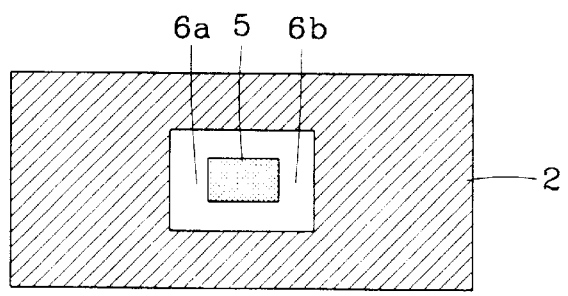
FIG. 1D is a plan view showing a planar structure of FIG. 1C.
Figure 2:
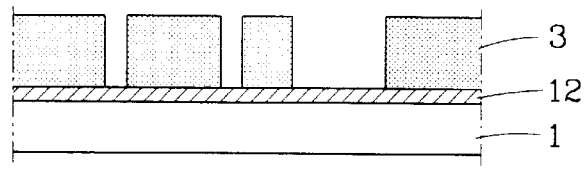
FIGS. 2A to 2D are cross-sectional views illustrating a method for manufacturing a PSM according to another conventional method.
Figure 2B:
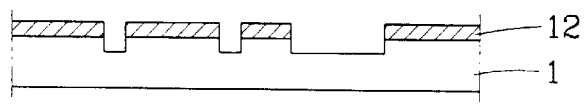
Figure 2C:
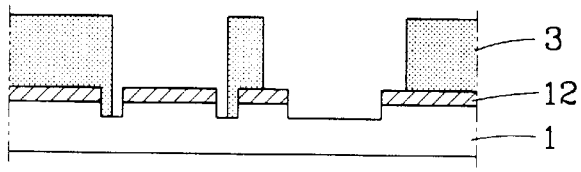
Figure 2D:
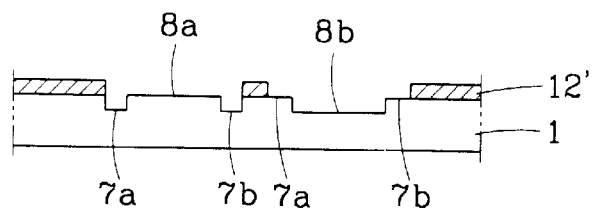
Figure 3A:
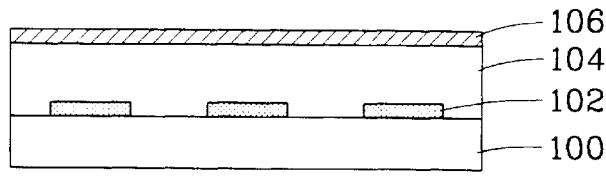
FIGS. 3A to 3E are cross-sectional views illustrating a method for manufacturing a PSM according to a first embodiment of the present invention.

At a first stage, as shown in FIG. 3A, light-shielding patterns 102 are formed so as to be spaced apart by a predetermined distance from each other on a transparent substrate 100. On the entire surface of substrate 100, including light-shielding patterns 102, a photosensitive organic material, such as a PFI-15 (25 cp) resist layer 104, is spin-coated to a thickness of 1.02 $\mu$m. Then, soft-baking is carried out for 120 seconds at 90° C. Thereafter, in order to alkali-treat the surface of resist layer 104, the above pattern is deposited for 250 seconds in a TOK NMD-3 undiluted solution of an organic material suppressing the developing solubility rate of the photosensitive organic material. As a result, an insoluble layer 106 is formed on the surface of resist pattern 104 in which the alkali solution soaks. At this time, the insoluble layer 106 is formed within the thickness range of about 5% to 50% of the total thickness of resist layer 104 obtained before the alkaline surface treatment is carried out.

Figure 3B:
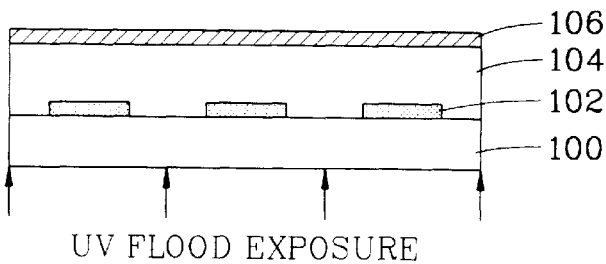

At a second stage, as shown in FIG. 3B, flood exposure is carried out for 0.43 second with an ultraviolet (UV) light ray on the back side of substrate 100. Then, baking is carried out for 110 seconds at a hot plate temperature of 100° C.

Figure 3C:
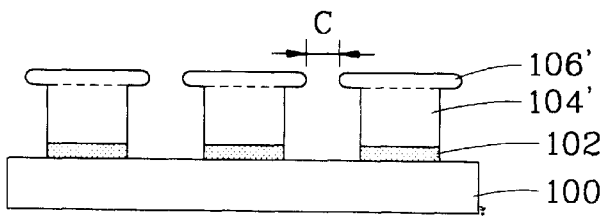

At a third stage, as shown in FIG. 3C, developing is carried out for 50 seconds with an NMD-3 development solution of the PUDDLE type. As a result, insoluble layer/resist stacked patterns 106' and 104' having over-hanging parts formed on the upper sides of both edges thereof are formed such that they are spaced apart by a distance "C" from each other on light-shielding patterns 102, according to a self-alignment fashion. This result, i.e., the formation of the insoluble layer pattern 106' having the over-hanging part formed on resist pattern 104', is due to the fact that the insoluble layer 106 formed by the alkaline surface treatment has a lower developing solubility rate than that of resist layer 104 and, thus, is etched slowly.

Figure 3D:
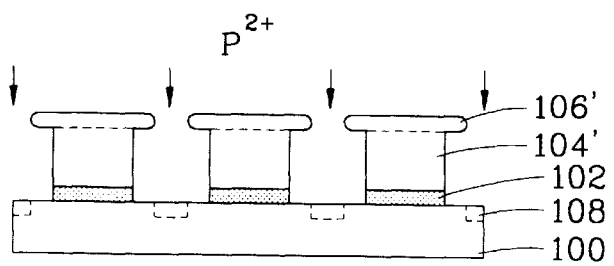

At a fourth stage, as shown in FIG. 3D, a phosphorous ion having a valence 2 ($P^{2+}$) is implanted at an accelerated voltage of 140 keV using insoluble layer/resist stacked patterns 106' and 104' as a mask, thereby forming phosphorous ion implanted regions 108 in substrate 100 corresponding to the aforementioned distance "C".

Figure 3E:
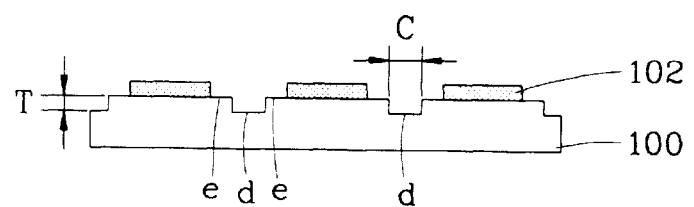

At a fifth stage, as shown in FIG. 3E, the pattern formed in the fourth stage is deposited in an NaOH solution of 25%, thereby selectively etching the substrate surface of phosphorous ion implanted region 108 and removing the insoluble layer/resist stacked patterns 106' and 104'. At this time, the substrate is etched to a depth having a thickness of "T" ($T=\lambda/2(n-1)$, where $\lambda$ is the exposure wavelength, and n is the refractive index of the shifter) thereby causing the phase shift. As a result, the manufacture of the self-aligned type out-rigger PSM is completed.

As shown in FIG. 3E, a main pattern (d) having a surface step is formed in the surface of the substrate between light-shielding patterns 102, and a supplementary pattern (e) without a surface step is formed on both sides of main pattern (d).

At this time, the width of main pattern (d) is defined on the basis of the center point of the substrate surface between neighboring light-shielding patterns 102, and is formed such that the widths of the left/right sides are the same on the basis of the center point. The width of supplementary pattern (e) is formed such that it is the same as the size obtained by subtracting the size of light-shielding pattern 102 from hard-soluble layer/resist stacked patterns 106' and 104'.

Meanwhile, in this embodiment, after performing the process shown in FIG. 3C, the PSM may be manufactured without carrying out the phosphorous ion implantation process. This can be done by directly etching the substrate to a thickness of "T" (where $T=\lambda/2(n-1)$) through a reactive ion etching (RIE) method utilizing an oxygen reaction ion (RI), and using the insoluble layer/resist stacked pattern 106' and 104' as a mask.

A second embodiment according to the invention will now be described.

Figure 4A:
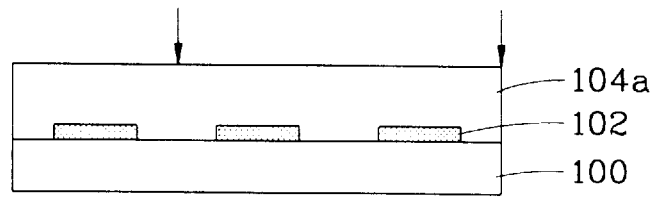
FIGS. 4A to 4G are cross-sectional views illustrating a method for manufacturing a PSM according to a second embodiment of the present invention.

At a first stage, as shown in FIG. 4A, light-shielding patterns 102 are formed so as to be spaced apart by a predetermined distance from each other on a transparent substrate 100. On the entire surface of substrate 100, including light-shielding patterns 102, a first resist layer 104a formed of a photosensitive organic material is spin-coated. Then, UV-ray exposure is selectively performed and developing is carried out, thereby etching first resist layer 104a so as to expose the surface of the substrate corresponding to the part exposed by the UV-ray.

Figure 4B:
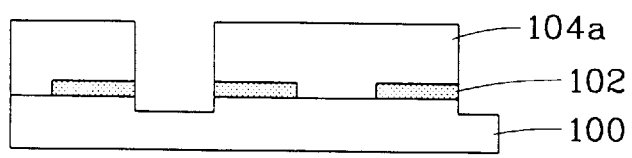

At a second stage, as shown in FIG. 4B, the portion of the substrate where the surface thereof is exposed is etched to a predetermined depth, using first resist layer 104a as a mask.

Figure 4C:
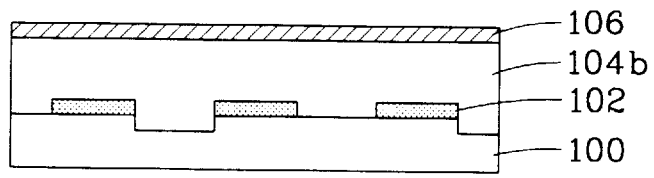

At a third stage, as shown in FIG. 4C, a second resist layer 104b of a photosensitive organic material is formed on the entire surface of the above pattern. As described with respect to the first embodiment, the alkaline surface treatment of second resist layer 104b is carried out, thereby forming a hard-soluble layer 106 on the surface of second resist layer 104b within which the alkali solution soaks.

Figure 4D:
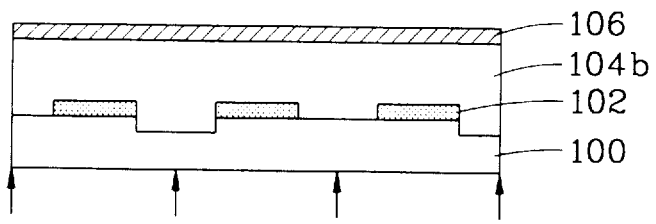

At a fourth stage, as shown in FIG. 4D, flood exposure is carried out using an UV-ray on the back side of transparent substrate 100.

Figure 4E:
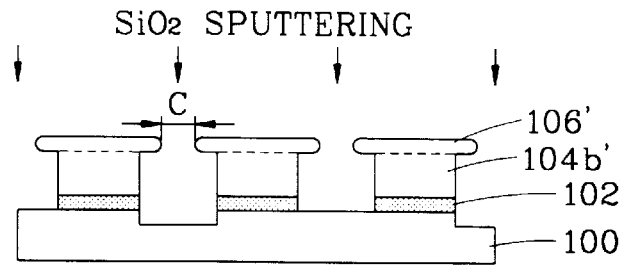
Figure 4F:
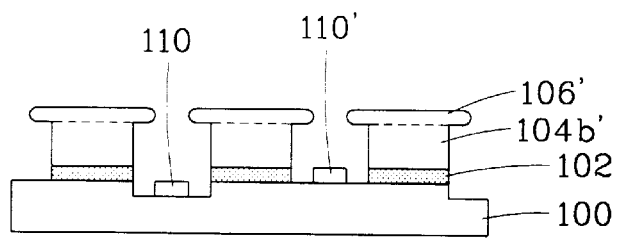

At a fifth stage, as shown in FIG. 4E, developing is carried out on the part exposed by the UV-ray. As a result, insoluble layer/second resist stacked patterns 106' and 104b' having over-hanging parts at the upper sides of both edges thereof are formed such that they are spaced apart by a distance "C" from each other on light-shielding patterns 102. Then, using the insoluble layer/second resist stacked patterns 106' and 104' as a protective film, $SiO_2$ material which can be used as a shifter (or $SiO_2$ material which can be used as a transparent part) is deposited by sputtering. As a result, as shown in FIG. 4F, $SiO_2$ patterns 110 and 110' are formed through the self-alignment method on the exposed surface of the substrate to have a thickness "T" (where $T=\lambda/2(n-1)$, $\lambda$ equals exposure wavelength, and n equals the refractive index of the shifter) sufficient to cause a phase shift.

Figure 4G:
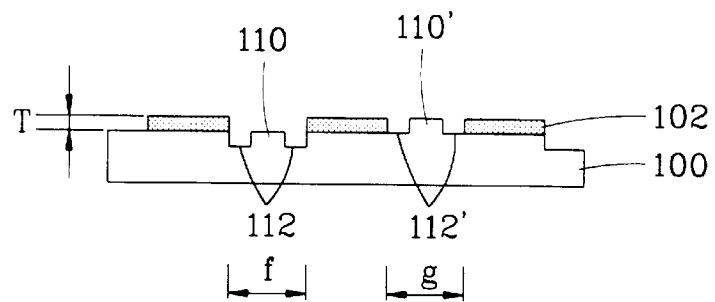

At a sixth stage, as shown in FIG. 4G, the insoluble layer/second resist stacked patterns 106' and 104' are removed, thereby completing the manufacture of the PSM.

As a result, as shown in this figure, $SiO_2$ pattern 110 formed on sinking part (f) of the substrate has a phase of 0° as the main pattern. Surrounding this main pattern, supplementary patterns 112 formed on the both sides thereof have a phase of 180°.

By putting light-shielding pattern 102 therebetween, the pattern adjacent to the out-rigger pattern has an opposite phase. $SiO_2$ pattern 110 formed on the center of substrate surface part (g) has a phase of 180° as the main pattern. Surrounding this main pattern, supplementary patterns 112' formed on both sides thereof have a phase of 0°.

Figure 4H:
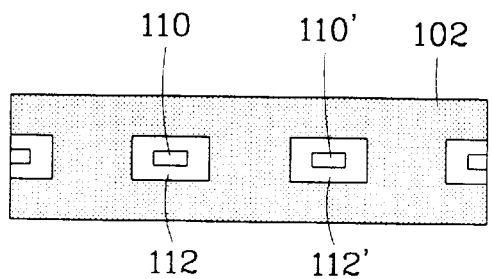
FIG. 4H is a plan view showing a planar structure of FIG. 4G.

A plan view of the completed out-rigger PSM is shown in FIG. 4H. From this figure, it can be appreciated that supplementary patterns 112 and 112' are formed so as to have a uniform width.

Figure 5:
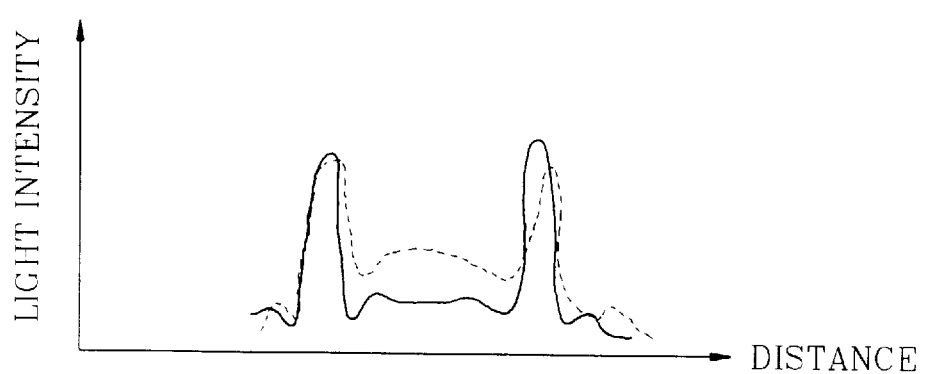
FIG. 5 is a graph showing a comparison of the variation of light intensity versus distance of PSMs which are manufactured according to the present invention and the conventional method, respectively.

FIG. 5 shows a graph illustrating a comparison of a variation of light intensity versus distance of the PSMs which are manufactured according to the present invention and the conventional method, respectively. In this graph, the dotted part indicates conventional light intensity and the solid line indicates light intensity of the present invention.

Referring to the graph of FIG. 5, when forming the supplementary pattern in the conventional case, the width of the supplementary pattern is varied along the location by misalignment. Thus, the light intensity between the main patterns is varied also, thereby reducing the light-shielding effect in the light-shielding region between two patterns. On the other hand, in the case of the present invention, the width of the supplementary pattern is formed uniformly with no relation to the location. Therefore, the light intensity between the neighboring patterns can be maintained symmetrically. In addition, the light-shielding effect can be improved.

As a result of the aforementioned process of the present invention, the alignment accuracy of the supplementary pattern and main pattern of the PSM is improved.

According to the present invention as described above, at least the following effects are obtained.

(1) Since the out-rigger pattern is formed after completing the light-shielding pattern in the initial stage, the under-cut or misalignment error of the light-shielding pattern can be prevented in advance.

(2) Since the supplementary pattern is defined through the etching process using the resist pattern including the hard-soluble layer located on the light-shielding pattern as a mask, self-alignment is made possible. In addition, it is easy to determine the width of the supplementary pattern.

(3) When the substrate is etched, wet etching is utilized after implanting the phosphorous ion of valence 2. Thus, a smooth surface of the substrate can be obtained.

(4) The accurate alignment between the main pattern and the supplementary pattern is now possible. Thus, symmetric light intensity between neighboring mask patterns can be obtained, resulting in the improvement of the light-shielding effect.

It will be apparent to those skilled in the art that various modifications and variations can be made in the method for manufacturing a self-aligned type out-rigger phase shift mask of the present invention without departing from the spirit or scope of the invention. Thus, it is intended that the present invention cover the modifications and variations of this invention provided they come within the scope of the appended claims and their equivalents.

What is claimed is:

1. A method of manufacturing a self-aligned type out-rigger phase shift mask, the method comprising the steps of:

forming light-shielding patterns spaced apart by a predetermined distance from each other on a transparent substrate;

forming a photosensitive organic layer on the light-shielding patterns and the substrate;

surface-treating the photosensitive organic layer with an organic material to form an insoluble layer on a surface of the photosensitive organic layer into which the organic material soaks;

performing back side exposure and development to flood an insoluble layer and photosensitive organic material stacked pattern having over-hanging parts on upper side edges of the stacked pattern;

selectively etching the substrate by using the insoluble layer and photosensitive organic material stacked pattern as a mask to define a first pattern between the light-shielding patterns and a second pattern on both sides of the first pattern; and removing the insoluble layer and photosensitive organic material stacked pattern.

2. A method of manufacturing a self-aligned type out-rigger phase shift mask as claimed in claim 1, wherein the step of surface-treating the photosensitive organic layer uses a solution including alkaline as the organic material.

3. A method of manufacturing a self-aligned type out-rigger phase shift mask as claimed in claim 1, wherein the step of surface-treating the photosensitive organic layer includes the step of suppressing the developing solubility rate of the photosensitive organic layer.

4. A method of manufacturing a self-aligned type out-rigger phase shift mask as claimed in claim 1, wherein the insoluble layer is formed to have a thickness in a range of approximately 5% to 50% of a total thickness of the photosensitive organic layer prior to the surface treatment.

5. A method of manufacturing a self-aligned type out-rigger phase shift mask as claimed in claim 1, wherein the step of defining the first and second patterns comprises the steps of implanting a phosphorous ion on a surface of the substrate using a photosensitive organic pattern as a mask; and etching a surface of the substrate where the phosphorous ion is implanted with an NaOH solution to a predetermined thickness.

6. A method for manufacturing a self-aligned type out-rigger phase shift mask as claimed in claim 1, wherein the step of defining the first and second patterns comprises the step of etching the substrate to a predetermined thickness through a reactive ion etching method, using a photosensitive organic pattern as a mask.

7. A method of manufacturing a self-aligned type out-rigger phase shift mask as claimed in claim 1, wherein the substrate is etched to a thickness T (where $T=\lambda/2(n-1)$, $\lambda$ is an exposure wavelength and n is a refractive index of a shifter) and configured to cause a phase shift.

8. A method of manufacturing a self-aligned type out-rigger phase shift mask as claimed in claim 1, wherein the first pattern is formed to have a portion located at a central point of a surface of the substrate between adjacent shielding patterns, and defined such that widths at left and right sides of the portion on either side of the central point are substantially equal.

9. A method of manufacturing a self-aligned type out-rigger phase shift mask as claimed in claim 8, wherein the second pattern is defined on multiple sides of the first pattern between the light-shielding patterns in accordance with a size dimension obtained by subtracting the light-shielding patterns from a corresponding size dimension of the insoluble layer/and photosensitive organic material stacked pattern.

10. A method of manufacturing a self-aligned type outrigger phase shift mask, the method comprising the steps of:

forming light-shielding patterns spaced apart by a predetermined distance from each other on a transparent substrate;

depositing a first photosensitive organic layer on the light-shielding pattern and the substrate and selectively exposing a surface of the substrate;

etching the exposed surface of the substrate to a predetermined thickness using the first photosensitive organic layer as a mask, and then removing the first photosensitive organic layer;

forming a second photosensitive organic layer on the light-shielding patterns and the substrate;

surface-treating the second photosensitive organic layer with an organic material to form an insoluble layer on a surface of the second photosensitive organic layer into which the organic material soaks;

performing back side flood exposure and development to form a stacked pattern of the insoluble layer and second photosensitive organic material, the stacked pattern having over-hanging parts on upper side edges of the stacked pattern;

forming a light-transmissive film on the exposed surface of the substrate using the stacked pattern as a mask; and removing the stacked pattern to define a first pattern and a second pattern on the substrate between the light-shielding patterns.

11. A method of manufacturing a self-aligned type outrigger phase shift mask as claimed in claim 10, wherein the light-transmissive film includes $SiO_2$.

12. A method of manufacturing a self-aligned type outrigger phase shift mask as claimed in claim 10, wherein the step of forming the light-transmissive film uses sputtering.

13. A method of manufacturing a self-aligned type outrigger phase shift mask as claimed in claim 10, wherein the light-transmissive film is formed to have a thickness T (where $T=\lambda/2(n-1)$, $\lambda$ is an exposure wavelength, and n is a refractive index of a shifter) and to cause a phase shift.

14. A method of manufacturing a self-aligned type outrigger phase shift mask as claimed in claim 10, wherein the step of surface-treating the photosensitive organic layer uses a solution including alkaline as the organic material.

15. A method of manufacturing a self-aligned type outrigger phase shift mask as claimed in claim 10, wherein the insoluble layer is formed to have a thickness in a range of approximately 5% to 50% of a total thickness of the second photosensitive organic layer prior to the surface treatment.

16. A method of manufacturing a self-aligned type outrigger phase shift mask as claimed in claim 10, wherein the first pattern is formed to have a portion located on a central point of the surface of the substrate between adjacent shielding patterns, and defined such that widths of left and right sides of the portion on either side of the central point are substantially equal.

17. A method of manufacturing a self-aligned type outrigger phase shift mask as claimed in claim 16, wherein the second pattern is defined on multiple sides of the first pattern between the light-shielding patterns in accordance with a size dimension obtained by subtracting the light-shielding patterns from a corresponding size dimension of the insoluble layer/second photosensitive organic material stacked pattern.

18. A method of manufacturing a self-aligned type outrigger phase shift mask, the method comprising the steps of:

forming light-shielding patterns spaced apart by a predetermined distance from each other on a transparent substrate;

forming a photosensitive organic layer on the light-shielding patterns and the substrate;

surface-treating the photosensitive organic layer with an organic material and suppressing a developing solubility rate of the photosensitive organic layer to form an insoluble layer on a surface of the photosensitive organic layer into which the organic material soaks;

performing back side flood exposure and development to firm an insoluble layer and photosensitive organic material stacked pattern having over-hanging parts on upper side edges of the stacked pattern;

selectively etching the substrate by using the insoluble layer and photosensitive organic material stacked pattern as a mask to define a main pattern and a secondary pattern on a surface of the substrate between the light-shielding patterns; and removing the insoluble layer and photosensitive organic material stacked pattern.

19. A method of manufacturing a self-aligned type outrigger phase shift mask, the method comprising the steps of:

forming light-shielding patterns spaced apart by a predetermined distance from each other on a transparent substrate;

depositing a first photosensitive organic layer on the light-shielding pattern and the substrate and selectively exposing a surface of the substrate;

etching the exposed surface of the substrate to a predetermined thickness using the first photosensitive organic layer as a mask, and then removing the first photosensitive organic layer;

forming a second photosensitive organic layer on the light-shielding patterns and the substrate;

surface-treating the second photosensitive organic layer with an organic material suppressing a developing solubility rate of the second photosensitive organic layer to form insoluble layer on a surface of the second photosensitive organic layer into which the organic material soaks;

performing back side flood exposure and development to form a stacked pattern of the insoluble layer and second photosensitive organic material, the stacked pattern having over-hanging parts on upper side edges of the stacked pattern;

forming a light-transmissive film on the exposed surface of the substrate using the stacked pattern as a mask; and removing the stacked pattern to define a main pattern and a secondary pattern on the substrate between the light-shielding patterns.

20. A method of manufacturing a self-aligned type outrigger phase shift mask, the method comprising the steps of:

forming light-shielding patterns spaced apart by a predetermined distance from each other on a transparent substrate;

forming a photosensitive organic layer on the light-shielding patterns and the substrate;

surface-treating the photosensitive organic layer with an organic material to form an insoluble layer on a surface of the photosensitive organic layer into which the organic material soaks;

performing back side flood exposure and development to form an insoluble layer and photosensitive organic material stacked pattern having over-hanging parts on upper side edges of the stacked pattern;

implanting phosphorous ions on a surface of the substrate using the insoluble layer and photosensitive organic material stacked pattern as a mask;

etching a surface of the substrate where the phosphorous ions are implanted with an NaOH solution to a predetermined thickness to define a first pattern between the light-shielding patterns and a second pattern on both sides of the first pattern; and removing the insoluble layer and photosensitive organic material stacked pattern.

21. A method of manufacturing a self-aligned type outrigger phase shift mask as claimed in claim 20, wherein the step of surface-treating the photosensitive organic layer uses a solution including alkaline as the organic material.

22. A method of manufacturing a self-aligned type outrigger phase shift mask as claimed in claim 20, wherein the step of surface-treating the photosensitive organic layer includes the step of suppressing the developing solubility rate of the photosensitive organic layer.

23. A method of manufacturing a self-aligned type outrigger phase shift mask as claimed in claim 20, wherein the insoluble layer is formed to have a thickness in a range of approximately 5% to 50% of a total thickness of the photosensitive organic layer prior to the surface treatment.

24. A method for manufacturing a self-aligned type outrigger phase shift mask as claimed in claim 20, wherein the first and second patterns in the step of etching a surface of the substrate comprises the step of etching the substrate to a predetermined thickness through a reactive ion etching method, using a photosensitive organic pattern as a mask.

25. A method of manufacturing a self-aligned type outrigger phase shift mask as claimed in claim 20, wherein the substrate is etched to a thickness T (where $T=\lambda/2(n-1)$, $\lambda$ is an exposure wavelength and n is a refractive index of a shifter) and configured to cause a phase shift.

26. A method of manufacturing a self-aligned type outrigger phase shift mask as claimed in claim 20, wherein the first pattern is formed to have a portion located at a central point of a surface of the substrate between adjacent shielding patterns, and defined such that widths at left and right sides of the portion on either side of the central point are substantially equal.

27. A method of manufacturing a self-aligned type outrigger phase shift mask as claimed in claim 26, wherein the second pattern is defined on multiple sides of the first pattern between the light-shielding patterns in accordance with a size dimension obtained by subtracting the light-shielding patterns from the insoluble layer and photosensitive organic stacked pattern.

\* \* \* \* \*

UNITED STATES PATENT AND TRADEMARK OFFICE
CERTIFICATE OF CORRECTION

PATENT NO. : 5,851,705
DATED : December 22, 1998
INVENTOR(S) : Jun-Seok LEE

It is certified that error appears in the above-indentified patent and that said Letters Patent is hereby corrected as shown below:

Column 10, line 9, change "firm" to --form--.

Signed and Sealed this

Twenty-fifth Day of May, 1999

Attest:

Q. TODD DICKINSON

*Attesting Officer*   Acting Commissioner of Patents and Trademarks